United States Patent
Singer et al.

(10) Patent No.: US 12,004,330 B2
(45) Date of Patent: Jun. 4, 2024

(54) SYNTHETIC MODULAR HOUSING WITH EMBEDDED COOLING BODY

(71) Applicant: ZF Friedrichshafen AG, Friedrichshafen (DE)

(72) Inventors: Michael Singer, Bärnau (DE); Oliver Küpfer, Gräfenberg (DE); Thomas Schober, Hahnbach (DE)

(73) Assignee: ZF FRIEDRICHSHAFEN AG, Friedrichshafen (DE)

( * ) Notice: Subject to any disclaimer, the term of this patent is extended or adjusted under 35 U.S.C. 154(b) by 0 days.

(21) Appl. No.: 17/817,827

(22) Filed: Aug. 5, 2022

(65) Prior Publication Data
US 2023/0040852 A1 Feb. 9, 2023

(30) Foreign Application Priority Data
Aug. 6, 2021 (DE) .................. 102021208578.4

(51) Int. Cl.
*G06F 1/16* (2006.01)
*H05K 5/00* (2006.01)
*H05K 7/00* (2006.01)
*H05K 7/20* (2006.01)

(52) U.S. Cl.
CPC ................ *H05K 7/20854* (2013.01)

(58) Field of Classification Search
CPC ........... H05K 7/20854; H05K 7/20845; H05K 7/20863; H05K 7/20872; H05K 7/20881
See application file for complete search history.

(56) References Cited

U.S. PATENT DOCUMENTS

| | | | | |
|---|---|---|---|---|
| 2006/0077643 | A1* | 4/2006 | Mayuzumi | H05K 5/0082 361/753 |
| 2009/0086437 | A1* | 4/2009 | Tsuyuno | H05K 7/20854 361/752 |
| 2010/0254093 | A1* | 10/2010 | Oota | B60R 16/0239 361/720 |
| 2012/0069532 | A1* | 3/2012 | Azumi | H05K 5/0069 361/752 |
| 2015/0156927 | A1* | 6/2015 | Tsuboi | H05K 7/20854 361/704 |
| 2017/0341607 | A1* | 11/2017 | Sumida | B60L 58/26 |
| 2018/0092255 | A1* | 3/2018 | Rojahn | H05K 5/03 |
| 2018/0302999 | A1* | 10/2018 | Söhner | H05K 5/0082 |
| 2019/0101123 | A1* | 4/2019 | Matsumura | H05K 7/20172 |

FOREIGN PATENT DOCUMENTS

DE 20 2017 104 164 U1 9/2017
EP 2 175 708 A1 4/2010

OTHER PUBLICATIONS

Office Action dated May 12, 2022 for German Patent Application No. 10 2021 208 578.4 (10 pp.), note: pp. 1 and 2 are English language Explanations to Section C. Result of Determination Document.

\* cited by examiner

*Primary Examiner* — Anthony M Haughton
(74) *Attorney, Agent, or Firm* — Crowell & Moring LLP

(57) ABSTRACT

The invention relates to a module housing made of plastic, in particular a thermosetting polymer, with an embedded cooling element and at least one screw sleeve, which has a collar with an exposed mounting surface with which the module housing can be mounted on a support functioning as an external heat sink. The cooling element and the at least one screw sleeve form a monolithic element with which heat can be conducted from the cooling element to the support via at least the mounting surface.

10 Claims, 3 Drawing Sheets

SYNTHETIC MODULAR HOUSING WITH EMBEDDED COOLING BODY

RELATED APPLICATION

This application claims the benefit of, and priority to, German Patent Application DE 10 2021 208 578.4, filed Aug. 6, 2021, which is incorporated by reference herein in its entirety.

TECHNICAL FIELD

The invention relates to a module housing made of plastic, in particular a thermosetting polymer, with an embedded cooling element that can be mounted on a heat sink.

BACKGROUND

Electrical and electronic devices or modules often have a housing made of a thermosetting polymer. Like housings made of thermoplastic, these have advantages over metallic housings in that they are very light, have good electrical insulating properties, and can be readily molded to a large variety of shapes with a very high surface quality.

The housing can encompass device or module components as a separate structure, or it can encase the device or module components in the manner of a casting compound. Housing components that must be made of metal, e.g. screw sleeves, or device or module components that must have an interface to the exterior, e.g. a cooling element, can be placed in the mold press during the production process, and incorporated in the housing during the molding or shaping process.

Housings made of a thermosetting polymer are more durable and heat-resistant than those made of thermoplastic, and this is advantageous with devices and modules that heat up substantially when in operation. When the housings are subjected to mechanical loads, thermosetting polymers have the disadvantage that they are more brittle, and break easily.

Housings for modules (hereinafter "module housings") have been made in the past from thermosetting polymers, in particular for electronic circuit modules. These circuit modules basically contain a printed circuit board populated with electronic components and a cooling element for discharging heat generated by the electronic components. In order for the cooling element to discharge the heat it absorbs, it must be brought into contact with an external heat sink, which requires a certain pressure over a very flat contact surfaces. A more even contact over a larger surface area results in a more efficient thermal discharge.

The relative position of the cooling element within the module housing depends on the design of the circuit module, in which the cooling element is normally placed in relation to the components such that the cooling element is connected directly to the end surface of the module housing, or indirectly thereto via a very short thermal conductor. The cooling element can consequently be placed within the module housing at a variety of positions in relation to the edge thereof. Facing outward, away from the circuit module, the cooling element has a fully embedded, exposed planar surface, which is brought in contact with a support that forms an external heat sink in that the module housing is screwed directly or indirectly to the support via two screw sleeves that are likewise embedded in the module housing.

A module housing from the prior art is shown in FIGS. 1a and 1b. In order to obtain a good force-fit connection between the cooling element and the heat sink, the two screw sleeves are placed in relation to the cooling element such that an imaginary connecting line between them runs over the exposed planar surface of the cooling element.

To obtain an optimal thermal discharge from the cooling element, the heat sink normally has a bearing surface that corresponds to the size and shape of the exposed planar surface of the cooling element. The embedded screw sleeves at a distance to the cooling element are aligned with corresponding threaded bushings in the heat sink when the cooling element is placed correctly in relation to the heat sink. These can be placed in the support that forms the heat sink or in components permanently connected to the support. To ensure that the cooling element is firmly pressed against the support during the assembly, the sizes and shapes of the bearing surfaces on the support that correspond to the cooling element and the screw sleeves are such that when the screws are screwed into the support through the screw sleeves, the cooling element is pressed firmly against the support. This results in bending tensions in the module housing along the imaginary line connecting the screw sleeves, which could result in crack formation in the case of a brittle plastic.

The object of the invention is to improve a module housing made of plastic with an embedded cooling element such that it can be attached to a support without bending tensions.

This object is achieved with a module housing made of plastic, in particular a thermosetting polymer, with an embedded cooling element and at least one embedded screw sleeve that has a collar with an exposed mounting surface that enables a mounting of the module housing on a support functioning as an external heat sink in that the cooling element and the at least one screw sleeve are connected to one another to form a monolithic element, such that heat is conducted away from the cooling element to the support through at least the mounting surface. When the module housing is screwed to the support, pressure is applied to the support via the mounting surface of the at least one screw sleeve, resulting in an equal counterpressure. This counterpressure is absorbed by the monolithic element formed by the cooling element and the at least one screw sleeve. Because the cooling element can only bend to a negligible extent as a result of the counterpressure, which may act on the monolithic element in different ways, depending on how it bears on the support, only negligible bending tensions are exerted on the plastic.

"Monolithic" means that the element forms a single unit that cannot be separated into individual components.

For technological reasons regarding tensions, there is advantageously only one screw sleeve, and the mounting surface is raised in relation to the cooling element. When the module housing is mounted on the support, only the mounting surface bears on the support, such that no bending tensions are exerted on the module housing. Furthermore, only the mounting surface needs to be subjected to a final surface processing in order to minimize the differences in evenness. Alternatively, the support can be conceived such that only the mounting surface bears on the support, even if the cooling element is not recessed in relation to the mounting surface. When heat is only discharged by conducting heat through the mounting surface, this has the particular advantage that only the mounting surface needs to be subjected to a final surface processing in order to minimize the differences in evenness. Even if surfaces of the monolithic element other than the mounting surface bear on the support, no substantial bending tensions are exerted on the plastic. To obtain an optimal thermal discharge from the cooling element to the screw sleeve, the cross section of the of the monolithic connection corresponds in terms of its height and/or width to the height of the cooling element and the outer diameter of the screw sleeve.

The screw sleeve is then entirely connected to the cooling element over the height of the cooling element along the cylindrical axis thereof, and the cross section of the monolithic connection between the cooling element and the screw sleeve is optimized for thermal discharge along the height of the cooling element.

The screw sleeve can also be connected to the cooling element over its width, which is at least as great as the outer diameter of the screw sleeve, such that a cross section of the monolithic connection between the cooling element and the screw sleeve is optimized for thermal discharge along the width of the cooling element.

To obtain an optimal pressure transfer, the mounting surface is preferably substantially circular.

To obtain an optimal heat dissipation, the mounting surface preferably has an outer diameter that is at least twice as large as the inner diameter of the mounting surface.

A module housing according to the invention can advantageously be used in an electrical assembly. This electrical assembly can be an inverter and/or a transmission.

An electrical assembly that has a module housing according to the invention is advantageously used in a motor vehicle, in particular an electric vehicle. As a result, applications for the module housing according to the invention can be found in the automobile industry.

BRIEF DESCRIPTION OF THE DRAWINGS

The invention shall be explained below in greater detail in reference to drawings of an exemplary embodiment. Therein.

DETAILED DESCRIPTION

Figure 1A:
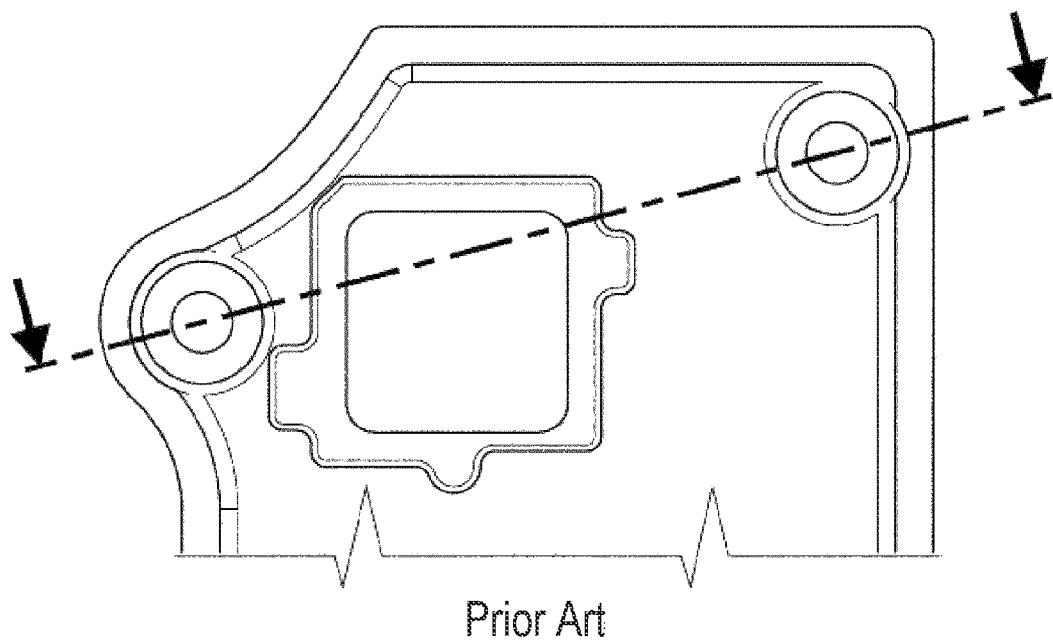
FIGS. 1a and 1b show a top view and a cutaway view of a module housing according to the prior art.
Figure 1B:
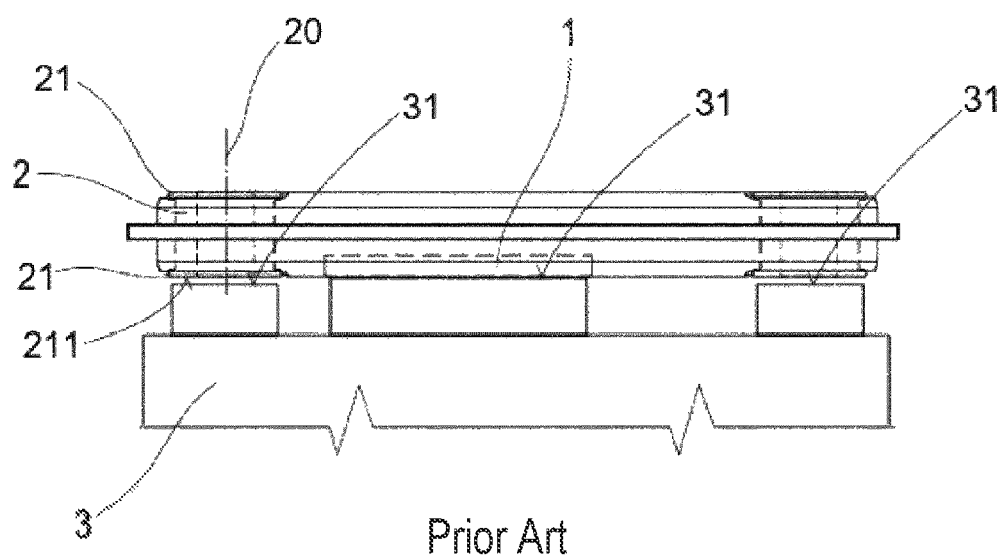

As in the prior art, shown in FIGS. 1a and 1b, a module housing according to the invention is also made of plastic, preferably a thermosetting polymer. A cooling element 1 and at least one screw sleeve 2 are embedded therein. In the prior art, thermal discharge from the cooling element 1 takes place directly via an exposed base surface of the cooling element (thermal interface), and the at least one screw sleeve 2 only functions as a mechanical interface, while the at least one screw sleeve 2 in a module housing according to the invention functions as both a mechanical and a thermal interface. The at least one screw sleeve 2 is connected to the cooling element 1 for this, thus forming a monolithic element 0.

Figure 2A:
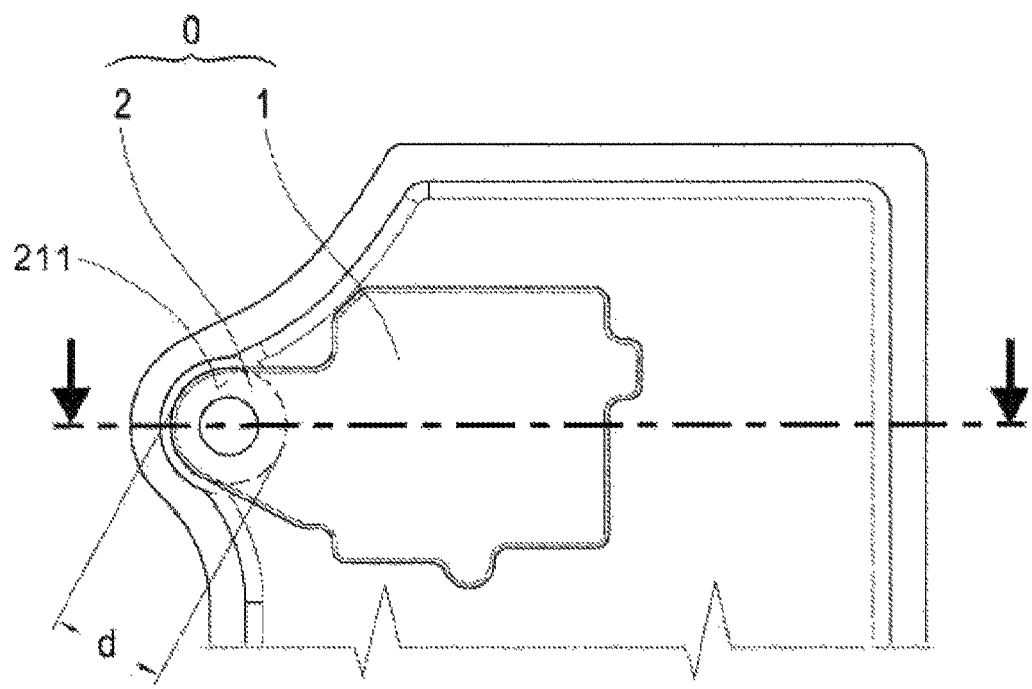
FIGS. 2a to 2c show a top view, cutaway view, and perspective illustration of a module housing according to the invention.
Figure 2B:
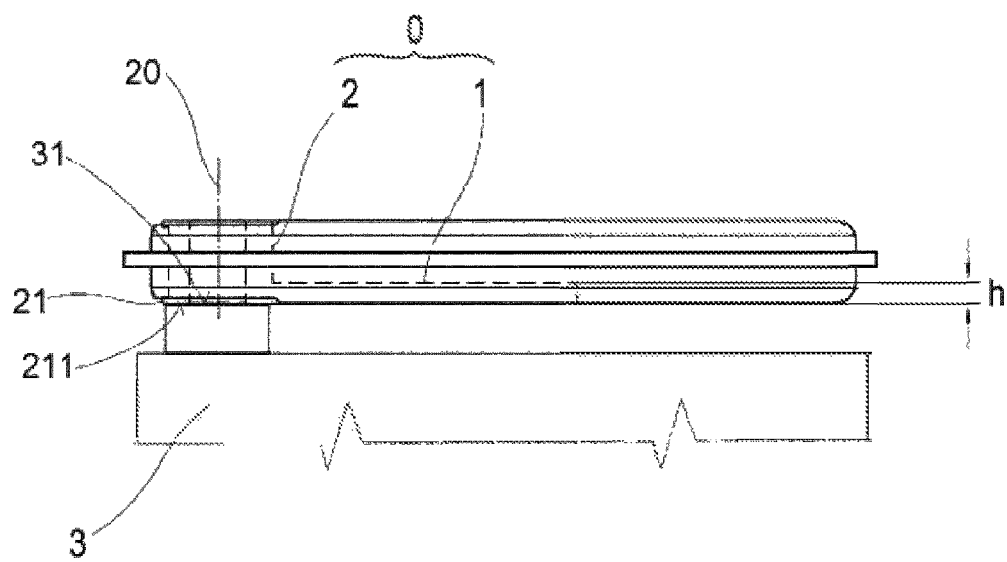
Figure 2C:
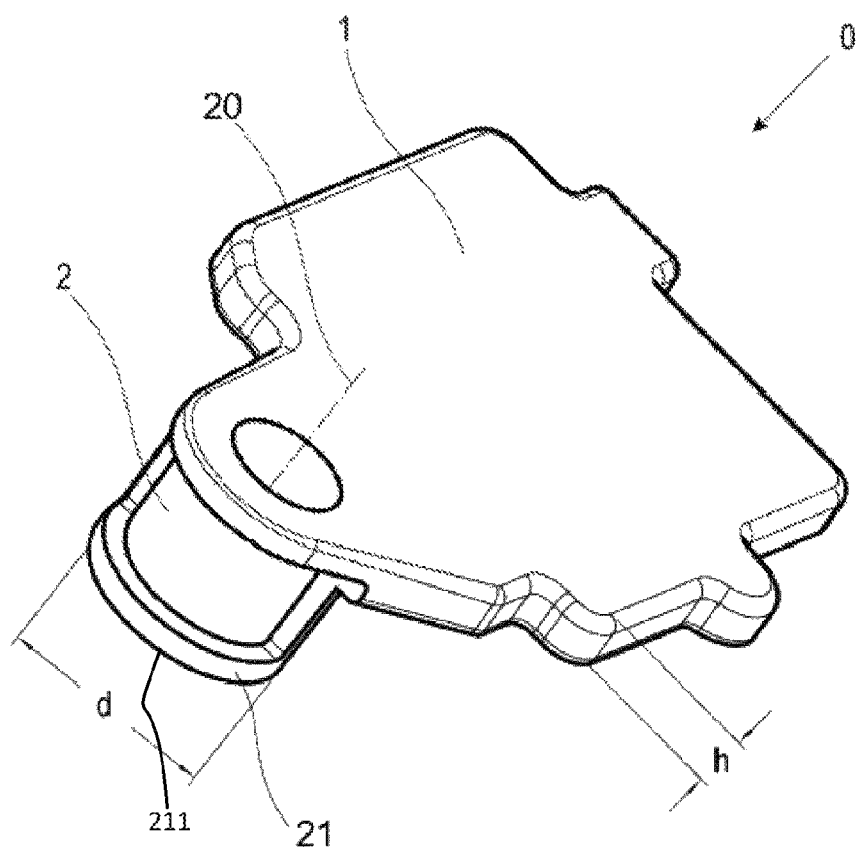

According to the exemplary embodiment shown in FIGS. 2a-2c, the monolithic element has precisely one screw sleeve 2, which has a collar 21 with an exposed mounting surface 211 that bears on a support 3 serving as an external heat sink when the module housing is mounted thereon. In this exemplary embodiment, the mounting surface 211 is an integral component of a planar base surface, which extends over the entire monolithic element 0.

When the module housing is mounted on a support 3 which has a bearing surface 31 facing the module housing that is limited to the size of the mounting surface, as shown in the drawings, heat is drawn off through thermal conduction, while force is only exerted thereto via the mounting surface 211. It is also advantageous that only the mounting surface needs to be subjected to a finishing process to ensure that it is even. With a larger bearing surface 31 on the support 3, up to the same size as the base surface of the monolithic element 0 (not shown in the drawings), heat is discharged through thermal conduction over the entire base surface, which requires, however, that the base surface and the bearing surface 31 are extremely flat. In order to press the entire base surface evenly against the bearing surface 31 on the support, there can also be one or two more screw sleeves 2 in the monolithic element.

| Reference Symbols | |
|---|---|
| 0 | monolithic element |
| 1 | cooling element |
| 2 | screw sleeve |
| 20 | cylindrical axis |
| 21 | collar |
| 211 | mounting surface |
| 22 | cylindrical axis |
| 3 | support |
| 31 | bearing surface |
| h | height of the cooling element |
| d | outer diameter of the screw sleeve |

The invention claimed is:

1. A module housing, comprising:
a cooling element and at least one screw sleeve,
wherein the at least one screw sleeve has a collar with a mounting surface with which the module housing can be mounted on a support and function as an external heat sink,
wherein the cooling element and the at least one screw sleeve form a monolithic element,
wherein the at least one screw sleeve is configured such that heat is conducted from the cooling element to the support via at least the mounting surface, and
wherein the mounting surface is raised in relation to an outer surface of the cooling element, forming a space between the cooling element and the support, such that when the module housing is mounted on the support, only the mounting surface bears on the support.

2. The module housing according to claim 1, wherein the at least one screw sleeve includes only one screw sleeve.

3. The module housing according to claim 1, wherein the at least one screw sleeve is completely connected to the cooling element over a height of the cooling element along a cylindrical axis of the at least one screw sleeve, and wherein a cross section of a monolithic connection between the cooling element and the at least one screw sleeve is configured for thermal discharge along the height of the cooling element.

4. The module housing according to claim 1, wherein the at least one screw sleeve is connected over its width with the cooling element, which corresponds to at least an outer diameter of the at least one screw sleeve, and a cross section of a monolithic connection between the cooling element and the at least one screw sleeve is configured for thermal discharge along a width of the cooling element.

5. The module housing according to claim 1, wherein the mounting surface is circular.

6. The module housing according to claim 5, wherein the mounting surface has an outer diameter that is at least twice the size of an inner diameter of the mounting surface.

7. The module housing according to claim 1, wherein the module housing is made of plastic.

8. An electrical assembly comprising a module housing according to claim 1.

9. A motor vehicle that has a control comprising an electrical assembly that has a module housing according to claim 1.

10. The module housing according to claim 7, wherein the plastic is a thermosetting polymer.

* * * * *